May 19, 1970 F. P. HEIMAN 3,513,364

FIELD EFFECT TRANSISTOR WITH IMPROVED INSULATIVE LAYER BETWEEN GATE AND CHANNEL

Original Filed Sept. 7, 1962 3 Sheets-Sheet 1

INVENTOR.
FREDERIC P. HEIMAN
BY
W.S. Hill
AGENT

INVENTOR.
FREDERIC P. HEIMAN
BY
W.S. Hill
AGENT

INVENTOR.
FREDERIC P. HEIMAN
BY
W. S. Hill
AGENT

United States Patent Office 3,513,364

Patented May 19, 1970

3,513,364
FIELD EFFECT TRANSISTOR WITH IMPROVED INSULATIVE LAYER BETWEEN GATE AND CHANNEL

Frederic P. Heiman, Cranbury, N.J., assignor to RCA Corporation, a corporation of Delaware Continuation of application Ser. No. 222,019, Sept. 7, 1962. This application Feb. 10, 1967, Ser. No. 629,340
Int. Cl. H01l *11/14*
U.S. Cl. 317—235 3 Claims

ABSTRACT OF THE DISCLOSURE

An insulated gate field effect transistor has an insulating layer intermediate overlapping portions of its source and drain and gate electrode, respectively, which provides capacitance between the overlapping portions which is less than the capacitance between the gate electrode and the charge carrier channel of the transistor. A layer of the semiconductive material immediately beneath the gate insulator has a lower resistivity than the remainder of the semiconductive material.

CROSS REFERENCE TO RELATED APPLICATION

Figure 1:
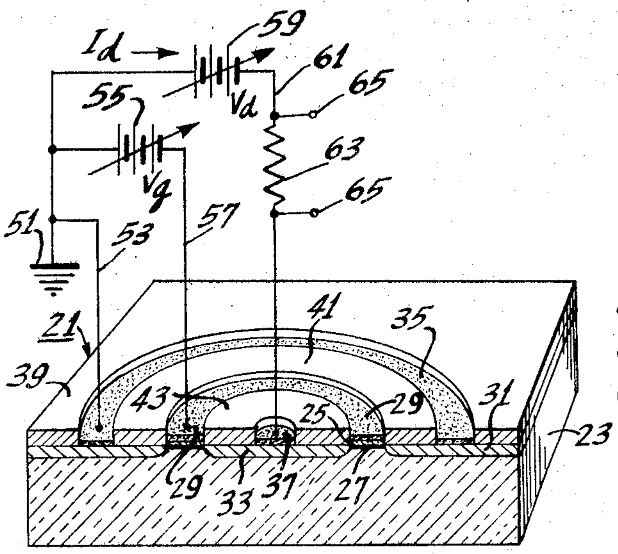

This application is a continuation of my copending application, Ser. No. 222,019, filed Sept. 7, 1962, now abandoned This invention relates to an improved insulated gate field-effect transistor and to a method of fabricating insulated gate field-effect transistors.

An insulated gate field-effect transistor comprises a channel of low resistivity semiconductor material and two spaced electrical contacts to the channel, which are referred to as the source and the drain respectively. An insulated gate field-effect transistor includes also a gate electrode adjacent and insulated from the channel. When a drain voltage is applied across the source and drain, a drain current flows through the channel. The magnitude of the drain current is a function of the drain voltage and of the number of free charge carriers in the channel. The number of free charge carriers in the channel may be modulated by a gate voltage applied to the gate electrode. This modulation is usually a variable reduction in the number of free charge carriers in the channel resulting in a variable reduction in drain current. Such modulation is referred to as the depletion mode of operation. In certain structures, the modulation may be a variable increase in the number of free charge carriers in the channel resulting in a variable increase in drain current. Such modulation is referred to as the enhancement mode of operation.

An object of this invention is to provide a novel insulated gate field-effect transistor.

Another object is to provide an improved method for preparing insulated gate field-effect transistors.

A field-effect transistor of the invention comprises a body of high resistivity semiconductor material, preferably single crystal silicon. The body has a chemically-reacted region thereon which includes a high resistivity layer of converted body material, preferably an oxide layer, and a low resistivity channel between the layer of converted body material and the bulk of the body. There is a source and a drain connected to the ends of the channel, and a gate electrode on the layer of converted body material opposite the channel.

A novel transistor of the invention is capable of operation in either or both the depletion and enhancement modes of operation. The transfer characteristic of the device is continuous over a relatively large range of gate voltages, and the drain current for zero gate voltage can be tailored over a substantial current range by simple changes in the method of fabrication.

The method of fabrication of the invention comprises producing at least two spaced deposited insulating layer portions on the surface of a high resistivity semiconductor body. The deposited layer portions contain impurities which impart conductivity of a particular type to the body. A chemically-reacted region is produced in an exposed surface of the body, as by heating a silicon body in an oxidizing atmosphere. The reacted region includes a high resistivity layer of converted body material and a low resistivity channel between the layer of converted body material and the bulk of the body. During the step of producing the reacted region, impurities diffuse from the deposited layer portions into the body to form in the body low resistivity impurity-diffused regions contiguous with and defining the ends of the channel. The impurity-diffused regions comprise the source and drain of the device. A gate electrode is produced, as by vapor deposition of a metal, on the layer of converted body material opposite and spaced from the channel.

By the method of the invention, the channel, the layer of converted body material, the source, and the drain may all be produced during the same processing step, following only a single masking of the semiconductor body. The characteristics of the device may be modified by a suitable choice of the semiconductor material, its resistivity and its conductivity type; by the selection of the impurity in the deposited layer portions and its concentration; and by the choice of time, temperature, and atmosphere used during the step of producing the reacted region.

An additional feature of the invention may be included in the transistor, if desired, by practicing the process of the invention. It is desirable that the channel length be as short as possible and that the gate electrode be the same effective length as the channel. This may be achieved without the gate electrode being the same actual length as the channel, by producing deposited layer portions which are substantially thicker than the layer of converted body material, and then producing a gate electrode that extends over the length of the converted layer and also over parts of the deposited layer portions. The effective gate length is that part of the gate electrode which is closest to the channel; that is, the part over the layer of converted body material. The effective gate length does not include the parts of the gate electrode which extend over the deposited layer portions, where there is a substantially greater spacing between the gate electrode and the path of drain current flow.

Figure 2:
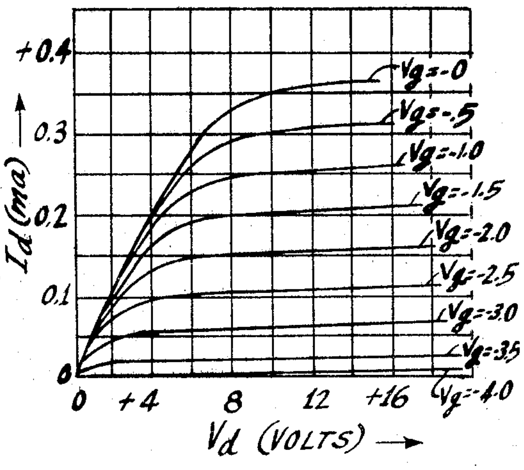
Figure 5:
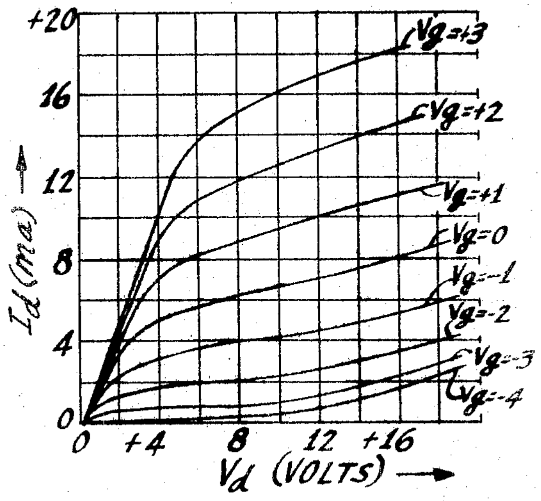
Figure 6:
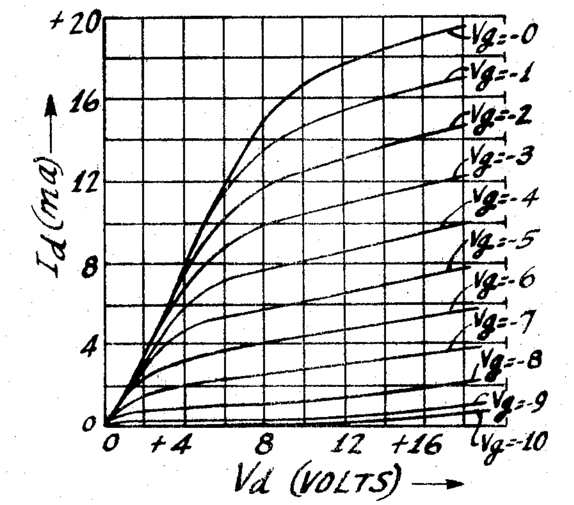
Figure 3:
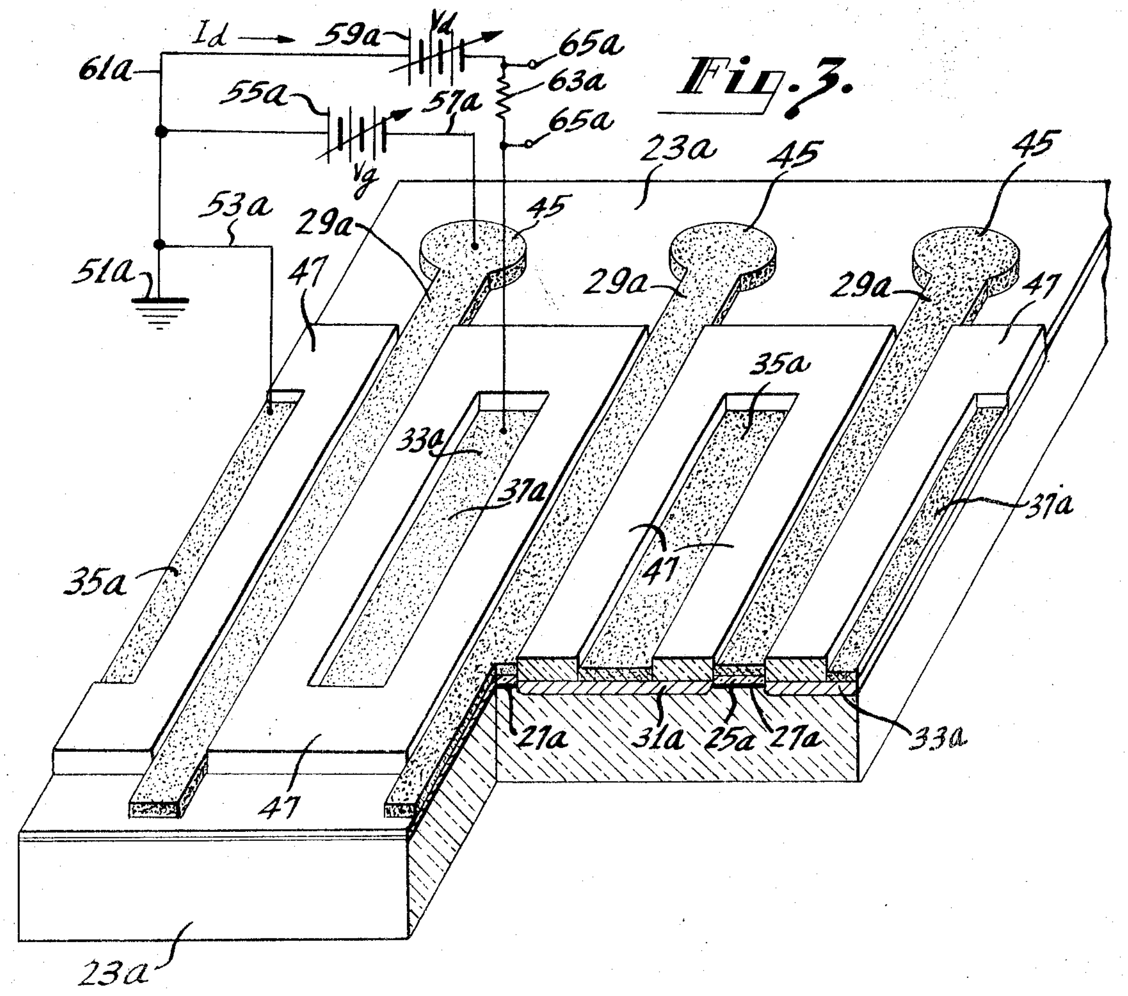
Figure 4A:
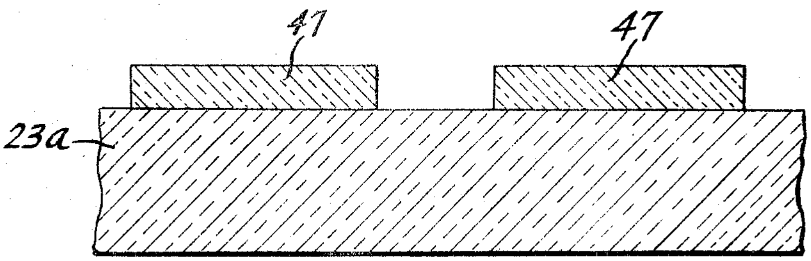
Figure 4B:
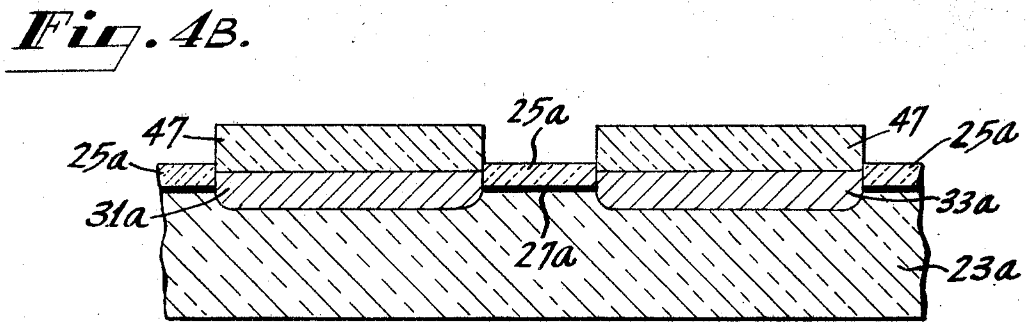
Figure 4C:
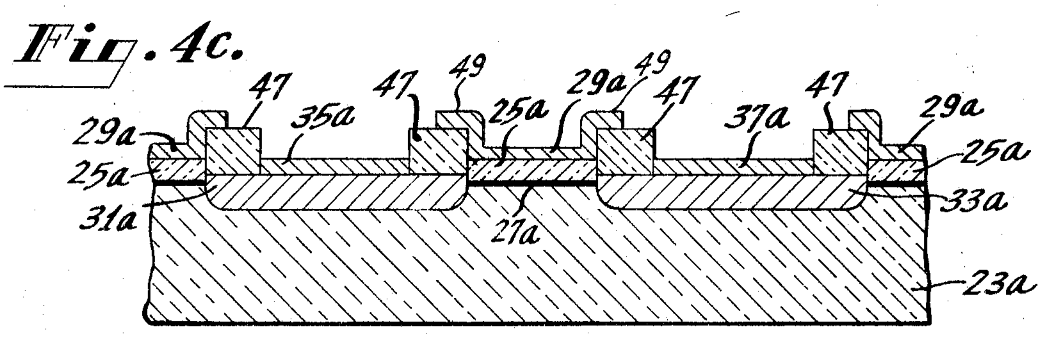
Figures 7, 8, 9:
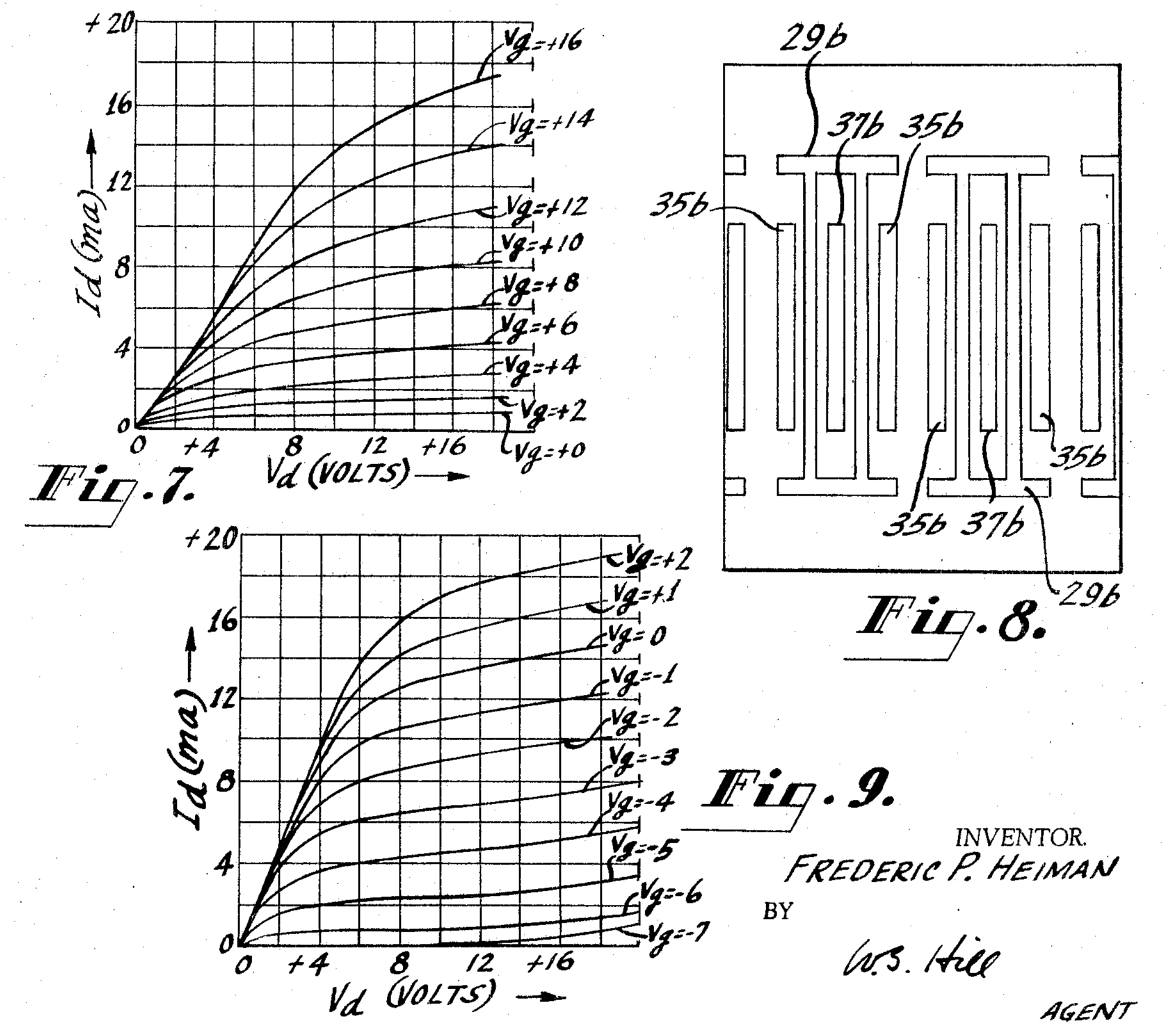

A more detailed description of the invention and illustrative embodiments thereof appear below in conjunction with the drawings in which:

FIG. 1 is a first embodiment of an insulated gate field-effect transistor of the invention having a circular or ring geometry and a typical circuit for operating the transistor, FIG. 2 is a family of curves illustrating the drain characteristics of the first embodiment of FIG. 1, FIG. 3 is a second embodiment of a field-effect transistor of the invention, having a ladder geometry and a typical circuit for operating the transistor, FIGS. 4A, 4B and 4C are broken away, partially sectional views of structures illustrating a method for fabricating a third embodiment of the invention, having a ladder geometry similar to the embodiment of FIG. 3, but having a different gate electrode design, FIG. 5 is a family of curves illustrating the drain characteristics of the third embodiment of the invention illustrated in FIG. 4C, FIG. 6 is a family of curves illustrating the drain characteristics of a fourth embodiment of the invention, having a geometry similar to the embodiment illustrated in FIG. 4C, except that the drain characteristics have been modified by a longer heating in dry oxygen, FIG. 7 is a family of curves illustrating the drain characteristics of a fifth embodiment of a field-effect transistor of the invention having a geometry similar to the embodiment of FIG. 4C except that the drain characteristics have been modified by a subsequent annealing in dry nitrogen, FIG. 8 is a sixth embodiment of a field-effect transistor of the invention, having a modified gate geometry, and FIG. 9 is a family of curves illustrating the drain characteristics of the field-effect transistor of FIG. 8.

Similar reference numerals are used for similar elements throughout the drawing.

FIG. 1 illustrates a first embodiment of a unipolar field-effect transistor 21 of the invention having a circular or ring geometry. The transistor 21 comprises a high resistivity body 23 of semiconductor material. The body 23 may be either single crystal or may be polycrystalline; and may be any one of the semiconductor materials used to prepare transistors in the semiconductor art.

The body 23 includes a reacted region comprising a high resistivity layer 25 of converted body material and a low resistivity channel 27 between the bulk of the base 23 and the high resistivity layer 25 of converted body material. For purposes of illustration, the body 23 in FIG. 1 is a single crystal body of P-type silicon having a resistivity of about 200 ohm-cm. The high resistivity layer 25 in this embodiment has generally a ring shape and is produced by oxidizing a portion of the surface of the body 23. The high resistivity layer 25 is about 2000 A. thick and consists essentially of pure silicon oxide produced by completely oxidizing silicon of the body 23. The low resistivity channel 27 is produced at the same time as the high resistivity layer 25 and is sometimes referred to as an inversion layer. The channel 27 extends under the entire high resistivity layer 25. The channel 27 is believed to have a low resistivity by virtue of the attraction of free charge carriers thereto by opposite charges held within the high resistivity layer 25. A gate electrode 29, preferably of a metal such as aluminum, rests on the high resistivity layer 25 opposite and spaced from the channel 27.

A source 31 connects to the outer periphery of the channel 27. A drain 33 connects to the inner periphery of the channel 27. The length of the channel 27, which is the distance between the outer and inner peripheries of the channel 27, is about 0.005 inch. As illustrated, the source 31 and the drain 33 are regions of the body 23 into which N-type impurities have been diffused to render them conducting. Any other structure which makes a suitable connection to the channel 27 may be used as the source 31 and drain 33.

A source electrode 35, of a generally ring shape and defined by adjacent deposited insulating portions 39 and 41, overlies and connects to a part of the source 31. A circular drain electrode 37, defined by adjacent deposited insulating portion 43, overlies and contacts a part of the drain connection 33. The source and drain electrodes 35 and 37 are preferably of metal, such as aluminum, and may be produced in the same step and of the same material as the gate electrode 29. The deposited insulating portions 39, 41 and 43 are of deposited silicon dioxide about 0.1 to 10 microns thick, and preferably about one micron thick.

FIG. 1 also illustrates a circuit for operating the transistor 21. In the circuit, the source electrode 35 is connected to a ground 51 by a source lead 53. The gate electrode 29 is connected to a terminal of a source 55 of gate voltage V*g* by a gate lead 57, the other terminal of the source 55 of gate voltage being grounded. The drain electrode 37 is connected to a terminal of an adjustable source 59 of drain voltage V*d* by a drain lead 61 through a load 63. The other terminal of the source 59 of drain voltage being grounded. Output terminals 65 are connected to the ends of the load 63.

In one mode of operation, the drain voltage V*d* is adjusted to a desired value. A gate voltage V*g*, which is the input or signal to the transistor, and which may be DC, AC in frequencies up to about 100 mc., or pulses, is provided from the gate voltage source 55, or may be impressed in addition to a field bias value. Drain current I*d*, which is the output of transistor, flows from ground 51, through the drain lead 61 to the drain electrode 37, then from the drain electrode 37 through the drain 33, the channel 27, the source 31 and the source electrode 35, and then from the source electrode 35 through the source lead to the ground 51. The drain current I*d* is a replica of the gate voltage V*g*. The output power may be many times the input power; and the input impedance may be many times the output impedance. Thus, the transistor may be used to translate from a higher impedance output, to amplify the input power, or both to translate input to a lower impedance and to amplify.

FIG. 2 is a family of static curves illustrating the drain characteristics (drain current I*d* plotted against drain voltage V*d*) of the transistor and circuit of FIG. 1. Each curve was made with the gate voltage V*g* held constant at the indicated value in volts and the source electrode 35 connected to ground. Increasing values of drain voltage V*d* (in volts) were applied to the drain and the corresponding drain currents I*d* (in milliamperes) were measured. The gate input impedance is capacitive at low frequencies. Time constant measurements indicate a leakage resistance in the range of $10^{14}$ to $10^{16}$ ohms. FIG. 2 illustrates the drain characteristics of a particular unit. Other units of this geometry may be fabricated which may be used with higher negative gate voltages and/or with positive gate voltages. The maximum usable gate voltage is believed to be about $\pm 100$ volts for the units of the type illustrated in FIG. 1 and is limited by the dielectric breakdown strength of the converted layer 25, which is about $5 \times 10^6$ volts/cm.

FIG. 3 illustrates a second field-effect transistor of the invention having a ladder geometry. The ladder geometry facilitates the interconnection of many devices on a single semiconductor body. In the embodiment of FIG. 3, the channel **27*a* is rectangular and is about 0.0005 inch long and is about 0.05 inch wide. The high resistivity layer 25*a* is of silicon oxide about 2700 A. thick which was converted from a single crystal body 23*a* of high resistivity silicon. The deposited insulating layer portions 47 are of deposited silicon dioxide about one micron thick. The round tabs 45 at the ends of the gate electrodes 29*a* permit simple connection thereto with a thermally-bonded wire. Adjacent gate electrodes 29*a* are spaced on about 0.010 inch centers. The source electrode 35*a* of one transistor may function also as the drain electrode for an adjacent transistor. Also, the drain electrode 37*a*** of one transistor may function also as the source electrode for an adjacent transistor.

The field-effect transistor illustrated in FIG. 3 may be prepared by the processing steps illustrated in FIGS. 4A, 4B and 4C. A single crystal body **23*a* of silicon having a high resistivity is provided; for example, a wafer of 500 ohm-cm. P-type silicon. A surface of the wafer is cleaned to expose the body material. This may be achieved, for example, by etching the surface of the wafer with a chemical etchant to remove all of the disturbed material on the surface. Next, heavily-doped silicon dioxide is deposited as a layer portion 47 on selected areas of the clean surface of the body 23*a*. For example, this is preferably achieved by depositing a uniform layer of doped silicon dioxide, as by thermal deposition from a doped oxy-silane, and then selectively removing the deposited oxide, as by selective etching using a photoresist technique. The thickness of the deposited oxide is preferably between about 1 and 10 microns. The deposited oxide layer portions 47 contain a relatively high concentration of impurities (also referred to as a dopant) which are N-type when present in silicon. Such impurities may be for example, antimony, arsenic, or phosphorus. The wafer is now heated at about 950° C. in dry oxygen for about one hour and then cooled. During the heating, the surface portions of the silicon wafer 23***a* which are not covered with the deposited silicon dioxide layer 47 are converted to silicon dioxide 25*a*. Such converted material is sometimes referred to as thermally-grown silicon dioxide. The converted material is essentially pure silicon dioxide and has a high resistivity of the order of $10^{18}$ ohm.-cm. A channel of N-type material 27*a* forms between the layer 25*a* of silicon oxide and the bulk of the body 23*a*. During the same heating step, impurities from the deposited oxide layer portions 47 diffuse into the silicon under the deposited oxide layer portions 47 to form diffused regions 31*a* and 33*a*, constituting a source and a drain respectively for the transistor, in which the impurities decrease in concentration with the distance from the deposited layer portions 47. At the point of connection to the channel 27*a* and above, the diffused regions 47 have a relatively low resistivity.

Apertures are now etched through the deposited oxide layer portions 47 permitting access to a central part of the diffused regions 31*a* and 33*a*. This may be achieved by applying a photoresist to selected areas of the deposited and of the thermally-grown silicon oxide layers 47 and 25*a*, and then etching away portions where the holes are desired. Then, metal, such as aluminum, is selectively deposited on central parts of the diffused regions 31*a* and 33*a*, where the apertures were previously etched, and on the layer 25*a* of converted body material opposite the channel 27*a* to form the source, drain, and gate electrodes 35*a*, 37*a* and 29*a* respectively. This may be accomplished by depositing, as by vapor deposition, a uniform layer of metal, such as aluminum, and then selectively removing the deposited metal using a photoresist technique leaving a source electrode 35*a*, a gate electrode 29*a*, and a drain electrode 37.

Ordinarily, the gate electrode 29*a* is coextensive with the layer 25*a* of converted body material. However, this construction presents some fabrication difficulties, especially in aligning the gate electrode 29*a* over the layer of converted body material 25*a*. In a third embodiment, the gate electrode 29*a* is made longer than the channel 27*a* to extend over parts of the deposited layer portions 47. The gate electrode 29*a* covers the entire layer 25*a* of converted material and parts of the deposited oxide layer portions 47. The extended portions of the gate electrode 29*a* are indicated by the numeral 49. Since the thickness of the deposited oxide layer 47 is at least four times that of the layer 25*a* of converted material, only a small amount of additional capacitance is thereby added to the device.

FIG. 5 is a family of curves illustrating the drain characteristics ($I_d$ plotted against $V_d$ for different gate voltages $V_g$) of the transistor of FIG. 4C. The transconductance is approximately 3,000 micromhos and the input capacitance measured at zero gate bias is fifteen picofarad, at about one mc. When the channel 27*a* is completely depleted of free electrons by an applied gate voltage, the channel resistance is about 20,000 ohms. This resistance is believed to be due to a parallel leakage path between the source and drain connections 31*a* and 33*a* around the gate electrode 29*a*.

This unit may be operated at both positive and negative gate voltages $V_g$. There is substantially no DC gate current with either positive or negative gate voltage. The upward turn of the curves for negative gate voltages at higher drain voltage is the effect of avalanche breakdown in the carrier depleted channel 27*a*. For example, the curve $V_g=-3$ volts turns upward for values of $V_d$ greater than about +10 volts. Gate current flow does not accompany this phenomenon.

Numerous variations may be made in the processing of the above-described transistors which affect the drain characteristics of the completed transistor. In one variation, the body region which is to be converted is first diffused with conductivity determining impurities. While such diffusion has been suggested previously for the purpose of producing a channel, the doping herein is not for the purpose of producing a channel, but is for the purpose of modifying the number of free electrons available in the channel normally formed between the converted layer and the bulk of the body. For this purpose, the density of impurities which are diffused is substantially smaller than previously suggested. The impurities may be of either P-type or N-type and are diffused to a depth and in a concentration just sufficient to modify the drain characteristics of the channel which would be produced with no additional impurity present. The choice of base material 23 is important. The base may be any single crystal or polycrystalline semiconductor material which may be used to prepare semiconductor devices. The base material should have a high resistivity and be capable of producing a high resistivity layer by chemical conversion of a region of the body. The preferred base material is single crystal silicon. Low resistivity P-type silicon is not suitable as the base material because only partial compensation will occur in the channel region and an N-type layer will not be obtained upon producing the converted layer. P-type silicon, typically between 2 and 1000 ohm-cm. resistivity, is a preferred base material. Generally in P-type silicon, the higher the resistivity of the base, the greater the number of free N-type charge carriers in the channel. If a P-type channel is desired between the bulk of the base and the layer of converted body material, then high resistivity N-type silicon should be used as the base.

The drain characteristics of the transistor of FIG. 4C may also be modified by changing the time in the range between 0.5 and 40 hours and/or temperature in the range between 850 and 1100° C. of heating used to produce the converted layer. Longer heating times and higher heating temperatures will convert the silicon of the body to a greater depth, and produce a channel of greater depth. FIG. 6 is a family of curves of a transistor similar in geometry to that illustrated in FIG. 4 C except that the heating step was continued for about two hours at about 950° C. in dry oxygen. This produced a thicker reacted region including a deeper channel. Also, depending on the atmosphere and of the surface treatment prior to oxidation, either a P-type or an N-type channel (inversion layer) may be formed. Either type of channel is operative. However, the connections to the channel should be of the same conductivity type as that of the channel. Where P-type source and drain connections are desired for silicon, the deposited oxide layer should contain P-type impurities for silicon such as indium or boron. Where N-type source and drain connections are desired for silicon, the deposited oxide layer should contain N-type impurities for silicon, such as arsenic, antimony, or phosphorus.

It has been found that baking the base for one or more hours in a dry inert atmosphere after the formation of the converted layer reduces the number of free charge carriers present in the channel. For instance, in the device of FIG. 4C, the concentration of free charge carriers in the channel produced during the heating step can be reduced by subsequently baking the silicon wafer at about 1000° C. for about one hour in dry nitrogen. The overall procedure is the same as that described above with respect to fabricating the device of FIG. 4C, except that before the electrodes are applied, the assembly is heated in an inert atmosphere and then cooled. FIG. 7 is a family of curves illustrating the drain characteristics of a transistor prepared by this modified process. The transistor is referred to as an enhancement field-effect transistor because the principal mode of operation is by the further enhancement to the channel of free charge carriers in response to a positive gate voltage, for an N-type channel.

FIG. 8 is a plan view illustrating a sixth embodiment of a field-effect transistor of the invention. The structure is similar to the device of FIG. 3 except that adjacent gate electrodes are connected at both ends so that the drain electrode of each unit is completely surrounded by a modified gate electrode. As illustrated in FIG. 8, each unit is comprised of two source electrodes **33*b* and a drain electrode 37*b* enclosed by the gate electrode 29*a***. In this embodiment, the drain electrode of one unit is not intended to function as a source electrode for an adjacent unit.

FIG. 9 is a family of curves illustrating the drain characteristics of the unipolar field-effect transistor illustrated in FIG. 8. The device may be operated in either the depletion mode or the enhancement mode (positive gate voltage). The transistor having the modified gate electrode has a lower leakage current than the transistor having the ladder geometry. This results from the fact that the drain electrode is completely surrounded by the gate electrode.

What is claimed is:

1. A unipolar transistor comprising a single crystal body of high resistivity P-type silicon, said body having a reacted region thereon, said reacted region including a high resistivity silicon oxide layer of completely converted body material and a low resistivity N-type channel between the bulk of said body and said layer of converted body material, a first low resistivity impurity-diffused region of N-type silicon in said body contacting and defining one end of said channel and constituting a source for said channel, a second low resistivity impurity-diffused region of N-type silicon in said body contacting and defining the other end of said channel and constituting a drain for said channel, a first deposited layer of silicon oxide on a portion of said source and abutting said layer of converted body material, a second deposited layer of silicon oxide on a portion of said drain and abutting said layer of converted body material, said first and second deposited layers being thicker than said layer of converted material, and a gate electrode upon said layer of converted material opposite and spaced from said channel and extending over at least a part of said first deposited layer and at least a part of said second deposited layer.

2. A field effect transistor comprising a body of monocrystalline semiconductive material having a surface, a channel of controllable conductivity within said body adjacent to said surface, a diffused source region and a diffused drain region within said body adjacent to said surface, said regions being connected to and defining the ends of said channel, and a gate spaced from said channel by insulator material, said insulator material and said gate extending over portions of at least one of said source and said drain regions, the insulator material over said portions being substantially thicker than the insulator material spacing said gate and said channel.

3. A field effect transistor comprising a body of monocrystalline semiconductive material having a surface, a channel of controllable conductivity within said body adjacent to said surface, a diffused source region and a diffused drain region within said body adjacent to said surface, said regions being connected to and defining the ends of said channel, and a gate spaced from said channel by insulator material, said insulator material and said gate extending over portions of both of said source and said drain regions, the insulator material over said portions being substantially thicker than the insulator material spacing said gate and said channel.

References Cited

UNITED STATES PATENTS

| | | | |
|---|---|---|---|
| 3,177,100 | 4/1965 | Mayer | 148—175 |
| 3,056,888 | 10/1962 | Atalla | 307—88.5 |
| 3,102,230 | 8/1963 | Kahng | 323—94 |
| 1,900,018 | 3/1933 | Lilienfeld | 317—231 |
| 2,566,666 | 9/1951 | Khauri et al. | |
| 3,206,670 | 9/1965 | Atalla | 323—93 |

JOHN W. HUCKERT, Primary Examiner

M. H. EDLOW, Assistant Examiner

U.S. Cl. X.R.

148—1.5